(12) United States Patent
Liao et al.

(10) Patent No.: US 8,988,254 B2
(45) Date of Patent: Mar. 24, 2015

(54) ULTRA-LOW POWER WAKEUP CIRCUIT DEVICE

(71) Applicant: Generalplus Technology Inc., Hsinchu (TW)

(72) Inventors: Tung-Tsai Liao, Hsinchu (TW); Hsin-Chou Lee, Hsinchu County (TW); Hsin-Lung Lai, New Taipei (TW)

(73) Assignee: Generalplus Technology Inc., Hsinchu (TW)

( * ) Notice: Subject to any disclaimer, the term of this patent is extended or adjusted under 35 U.S.C. 154(b) by 217 days.

(21) Appl. No.: 13/855,030

(22) Filed: Apr. 2, 2013

(65) Prior Publication Data
US 2013/0293399 A1 Nov. 7, 2013

(30) Foreign Application Priority Data
May 2, 2012 (TW) .............................. 101115552 A

(51) Int. Cl.
*H03K 17/94* (2006.01)
*H03M 11/20* (2006.01)
*H03M 11/08* (2006.01)
*G06F 13/42* (2006.01)
*G08B 25/00* (2006.01)

(52) U.S. Cl.
CPC .............. *H03M 11/20* (2013.01); *H03M 11/08* (2013.01)

USPC ................ 341/26; 341/22; 340/1.1; 340/16.1

(58) Field of Classification Search
USPC ............................... 341/26, 22; 340/1.1–16.1
See application file for complete search history.

(56) References Cited

U.S. PATENT DOCUMENTS

| 5,790,054 A * | 8/1998 | Hsu et al. .......................... 341/22 |
| 5,925,110 A * | 7/1999 | Klein ............................... 710/15 |
| 2006/0232446 A1 * | 10/2006 | Li .................................... 341/26 |
| 2010/0259424 A1 * | 10/2010 | Wang et al. ....................... 341/26 |

* cited by examiner

*Primary Examiner* — Jennifer Mehmood
*Assistant Examiner* — Omar Casillashernandez
(74) *Attorney, Agent, or Firm* — Bacon & Thomas, PLLC

(57) ABSTRACT

An ultra-low power wakeup circuit device includes a keyboard, a key scan circuit, a storage unit, and a comparator unit. The key scan circuit sequentially outputs scanning signals from the first scan line to N-th scan line for acquiring N key scan data. The key scan circuit performs an XOR operation on the N key scan data to generate a current key scan data. The storage unit is connected to the key scan circuit for receiving the current key scan data and storing the current key scan data as a previous key scan data. The comparator unit is connected to the key scan circuit and the storage unit for comparing the current key scan data with the previous key scan data. When the current key scan data is different from the previous key scan data, the comparator unit generates a wakeup signal.

6 Claims, 8 Drawing Sheets

Save Data=A^B^C^D^E^F

| Scan Line | Scan data (IO5~IO0) A Key, B Key Both Pressed | A Key Open (IO5~IO0) A Key Open, B Key Pressed | B Key Open (IO5~IO0) A Key Pressed, B Key Open |
|---|---|---|---|
| IO0 | 00000x (A) | 00000x (A) | 00000x (A) |
| IO1 | 0100x0 (B) | 0100x0 (B) | 0000x0 (B) |
| IO2 | 000x00 (C) | 000x00 (C) | 000x00 (C) |
| IO3 | 00x000 (D) | 00x000 (D) | 00x000 (D) |
| IO4 | 1x0010 (E) | 0x0010 (E) | 1x0000 (E) |
| IO5 | x10000 (F) | x00000 (F) | x10000 (F) |
| Save Data (Current Key Scan Data) | 100010 | 010010 | 110000 |

ULTRA-LOW POWER WAKEUP CIRCUIT DEVICE

BACKGROUND OF THE INVENTION

1. Field of the Invention

The present invention relates to the technical field of key scanning and, more particularly, to an ultra-low power wakeup circuit device.

2. Description of Related Art

With the advanced technologies, the electronic skills have been developed from the earliest vacuum tubes and transistors to the integrated circuit (IC) chips, which have been widely used. Thus, a variety of electronic products have gradually become indispensable necessities in daily living for modern people. Many articles have been increasingly electrized for the purpose of convenient use.

Many control methods used in electronic products, such as computers, mobile phones, and the like, typically use a button control. Generally speaking, the methods of detecting the scanning of keyboard buttons are grouped into two types, i.e., a matrix-type scan and a triangular-type scan.

FIG. 1 is a schematic diagram illustrating a circuit of a typical triangular-type scan keyboard. As shown in FIG. 1, the circuit includes a triangular-type scan keyboard controller 100, six vertical scan lines VS11-VS16, six horizontal scan lines HS11-HS16, and six I/O pins IO0-IO5. When a keyboard button detection starts, the I/O pins IO0-IO5 of the horizontal scan lines HS11-HS16 sequentially output scan pulses. More particularly, when one of the I/O pins IO0-IO5 outputs the scan pulse, the remaining pins perform the detection. For example, when the I/O pin IO1 outputs the scan pulse, the I/O pins IO1-IO5 perform the detection. Further, if the I/O pin IO1 outputs the scan pulse and the button 101 is pressed, the vertical scan line VS15 and the horizontal scan line HS11 are short-circuited. Accordingly, the scan pulse is received by the I/O pin IO4. In this case, the triangular-type scan keyboard controller 100 can determine that the button 101 is pressed.

As compared with a matrix-type scan keyboard, both have the keyboard controller with six I/O pins, but the triangular-type scan keyboard controller 10 can control 15 buttons while the matrix-type scan keyboard controller can control 9 buttons. In other words, under the consideration of the I/O resources of an integrated circuit (IC), the triangular-type scan keyboard controller can reduce the number of used I/O pins in view of the same number of buttons to be controlled.

However, the triangular-type scan keyboard controller chip typically consumes the current ranging from several hundreds of µA to several mA, which is still acceptable with respect to a high-power system but unacceptable by, for example, the sleep current of a remote controller that is limited to several µA.

To reduce the current consumption, US Patent Publication No. 2010/0259424 has disclosed a power saving method in a sleep mode. The method provides a first clock source and a second clock source, wherein a frequency of the second clock source is much lower than a frequency of the first clock source. In a normal mode, a scan pulse from the I/O pins is sequentially outputted according to the frequency of the first clock source. In the sleep mode, the scan pulse from the I/O pins is sequentially outputted according to the frequency of the second clock. Namely, in the sleep mode, the second clock source with relatively lower frequency is used to reduce the current consumption.

However, for either the matrix-type or the triangular-type scan keyboard, the keys may be blocked due to the humidity or other factors. For example, a user, who sits on a sofa and uses a remote control to select and watch one program, may sit on the remote control in carelessness, so that the keyboard controller chip cannot enter in the sleep mode and thus wastes the power.

Therefore, it is desirable to provide an improved ultra-low power wakeup circuit device to mitigate and/or obviate the aforementioned problems.

SUMMARY OF THE INVENTION

The object of the present invention is to provide an ultra-low power wakeup circuit device, which can reduce the power consumption and can be used in a handheld device to prolong the use life. In addition, the capacity of a storage device required in the ultra-low power wakeup circuit device can be reduced.

According to a feature of the invention, an ultra-low power wakeup circuit device is provided, which includes a keyboard, a key scan circuit, a storage unit, and a comparator unit. The keyboard has N scan lines, and every two scan lines has a key in-between, where N is an integer greater than one. The key scan circuit is connected to the N scan lines for sequentially outputting scanning signals of the first scan line to N-th scan line in a predetermined time, thereby acquiring N key scan data of the N scan lines when a desired key is pressed and two scan lines corresponding to the desired key are short-circuited. The key scan circuit processes the N key scan data for generating a current key scan data. The storage unit is connected to the key scan circuit for receiving the current key scan data and storing the current key scan data as a previous key scan data. The comparator unit is connected to the key scan circuit and the storage unit for comparing the current key scan data with the previous key scan data. When the current key scan data is different from the previous key scan data, the comparator unit generates a wakeup signal.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
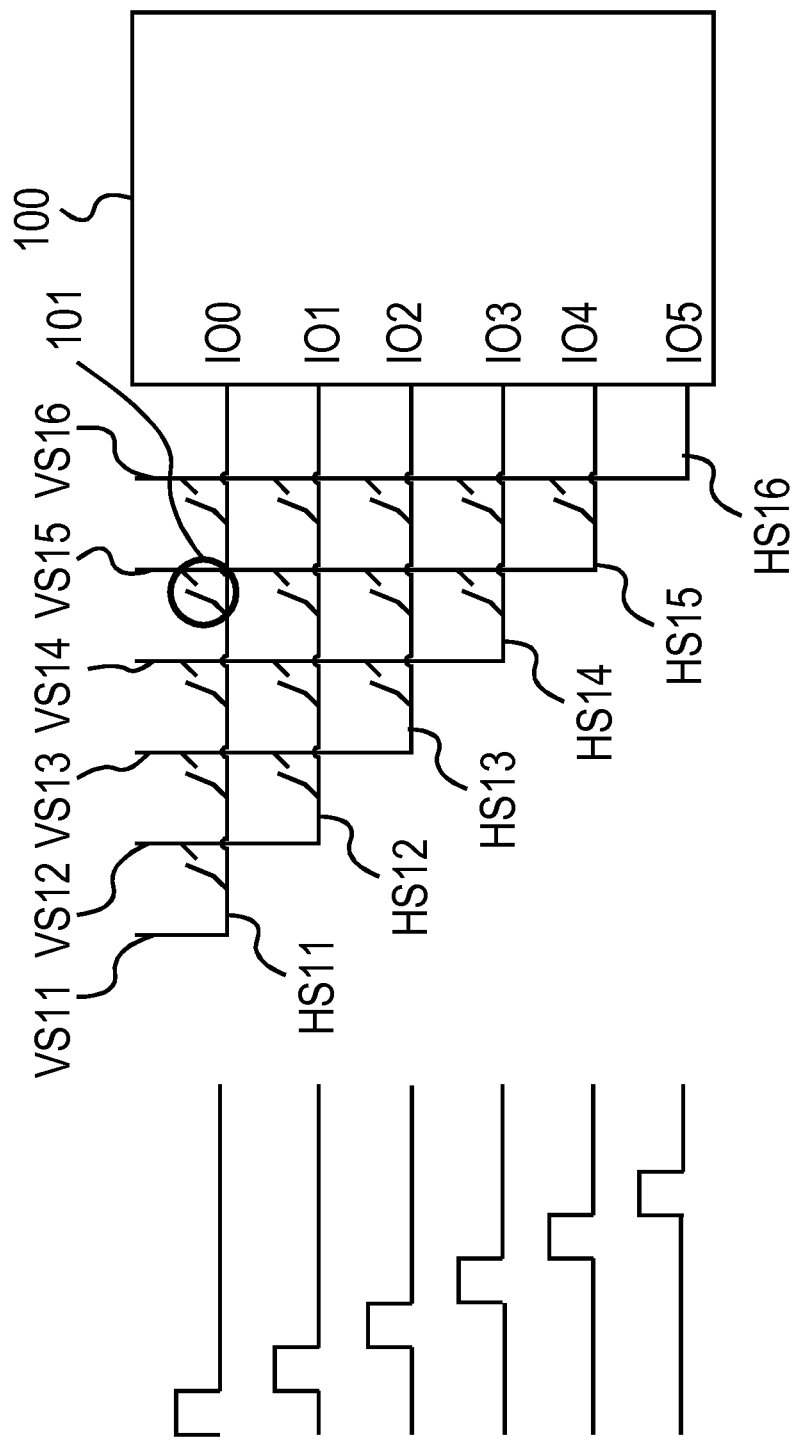
FIG. 1 is a schematic diagram illustrating a circuit of a typical triangular-type scan keyboard.
Figure 2:
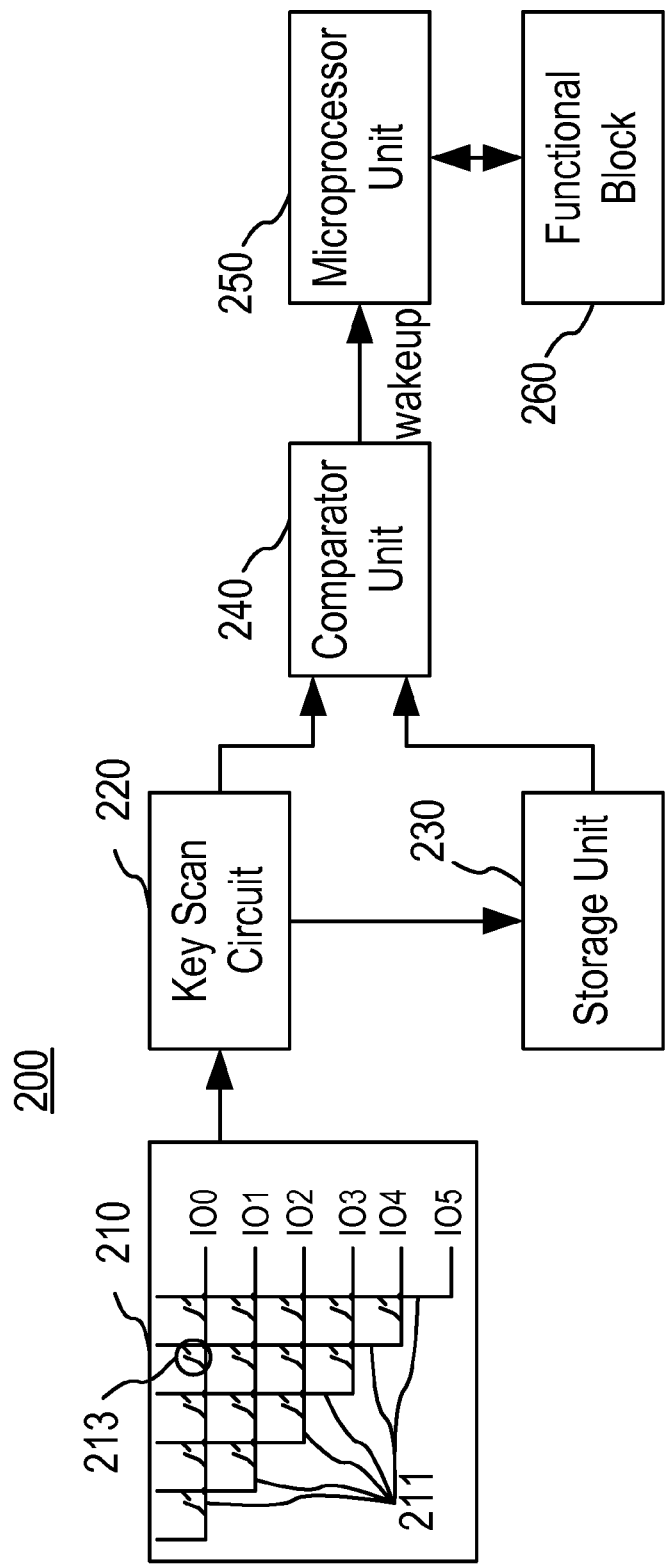
FIG. 2 is a block diagram of an ultra-low power wakeup circuit device according to the invention.

The invention provides an ultra-low power wakeup circuit device, which is used in a keyboard. FIG. 2 is a block diagram of the ultra-low power wakeup circuit device 200 according to the invention, which includes a keyboard 210, a key scan circuit 220, a storage unit 230, a comparator unit 240, a microprocessor unit 250, and at least one functional block 260.

The keyboard 210 has N scan lines 211, with a key installed in between every two of the N scan lines, where N is an integer greater than one. The keyboard 210 is a triangular-type scan keyboard with N×(N−1)/2 keys. In this embodiment, N is 6 for convenient description.

The key scan circuit 220 is connected to the N scan lines 211. The key scan circuit 220 sequentially outputs scanning signals of the first scan line to N-th scan line in a predetermined time. When a desired key is pressed, two scan lines corresponding to the desired key are short-circuited, and N key scan data of the N scan lines is acquired. The key scan circuit processes the N key scan data for generating a current key scan data.

The storage unit 230 is connected to the key scan circuit 220 for receiving the current key scan data and storing the current key scan data as a previous key scan data. The storage unit 230 is an N-bit storage device.

The comparator unit 240 is connected to the key scan circuit 220 and the storage unit 230. The comparator unit 240 compares the current key scan data with the previous key scan data. When the current key scan data is different from the previous key scan data, the comparator unit 240 generates a wakeup signal, denoted as "wakeup". When the current key scan data is identical to the previous key scan data, the comparator unit 240 does not generate the wakeup signal "wakeup".

The microprocessor unit 250 is connected to the comparator unit 240 and the keyboard 210. The microprocessor unit 250 has a sleep mode and a work mode. When the comparator unit 240 generates the wakeup signal "wakeup", the microprocessor unit 250 changes from the sleep mode into the work mode according to the wakeup signal "wakeup". When the comparator unit 240 does not generate the wakeup signal "wakeup", the microprocessor unit 250 remains in the sleep mode. The microprocessor unit 250 has multiple I/O pins connected to the N scan lines 211 of the keyboard 210 in order to acquire a key pressed by a user for a further processing.

When the microprocessor unit 250 is in the sleep mode, the at least one functional block 260 does not work.

Figure 3:
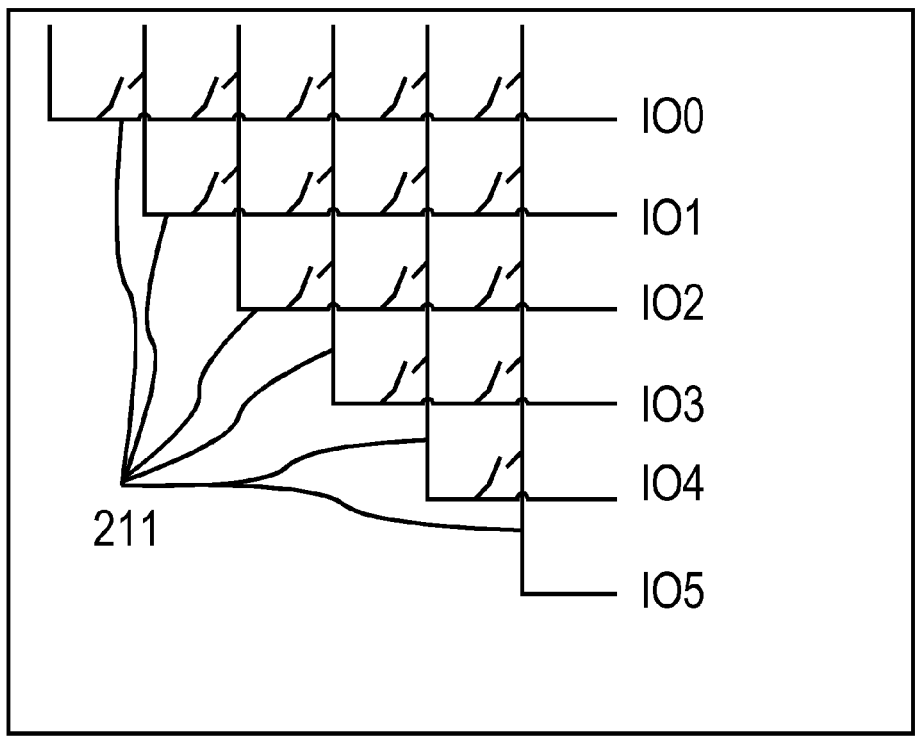
FIG. 3 is a schematic diagram of an operation of a key scan circuit according to the invention.

FIG. 3 is a schematic diagram of an operation of the key scan circuit 220 according to the invention. As shown in FIG. 3, the key scan circuit 220 generates the current key scan data to indicate that no key in FIG. 3 is pressed. In addition, "x" in 00000x(A) in FIG. 3 indicates that the key scan circuit 220 outputs a scan pulse from the scan line corresponding to the I/O pin IO0 while the other scan lines corresponding to the I/O pins IO1-IO5 perform a detection.

Each of the N key scan data has N bits (in this example, 6 bits). When a key between an i-th scan line and a j-th scan line is pressed, the i-th and j-th bits of the key scan data corresponding to the key is 1b ("1" in binary), where i and j are each an index value. When the key between an i-th scan line and a j-th scan line is not pressed, the i-th bit and j-th bit of the corresponding key scan data is 0b ("0" in binary).

Since no key is pressed, the N key scan data includes "00000x(A)", "0000x0(B)", "000x00(C)", "00x000(D)", "0x0000(E)", and "x00000(F)".

The key scan circuit 220 performs an XOR operation on the N key scan data for generating the current key scan data, denoted as Save Data, with N bits. The current key scan data Save Data=A^B^C^D^E^F=0 0 0 0 0 0, where ^ indicates an XOR operation. When the XOR operation is performed, "x" is regarded as "0". The storage unit 230 is connected to the key scan circuit 220 in order to temporarily store the current key scan data Save Data (=000000) as a previous key scan data.

Figure 4:
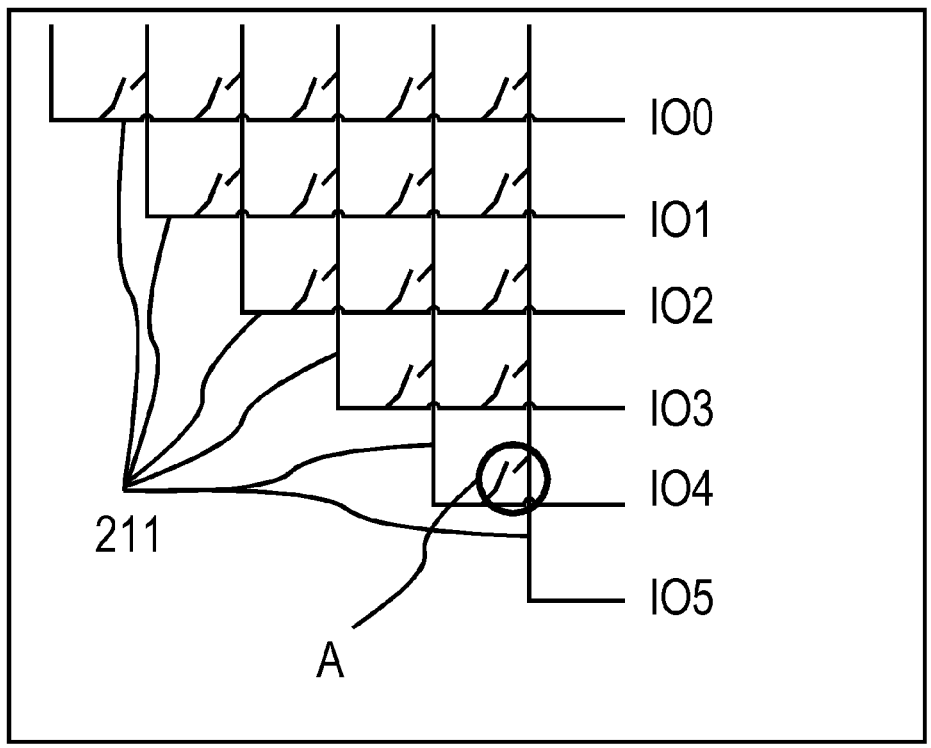
FIG. 4 is a schematic diagram of another operation of a key scan circuit according to the invention.

FIG. 4 is a schematic diagram of another operation of the key scan circuit 220 according to the invention, in which one key is pressed and the key scan circuit 220 generates the current key scan data. As shown in FIG. 4, the pressed key is located on the scan lines corresponding to the I/O pins IO4 and IO5, and in this case the key scan circuit 220 generates the N current key scan data, i.e., "00000x(A)", "0000x0(B)", "000x00(C)", "00x000(D)", "1x0000(E)", and "x10000(F)". Thus, the current key scan data Save Data=A^B^C^D^E^F=1 1 0 0 0 0.

The comparator unit 240 compares the current key scan data Save Data (=110000) with the previous key scan data (=000000). Because the two data are different, i.e., the key A shown in FIG. 4 is pressed, the comparator unit 240 generates a wakeup signal "wakeup" to change the microprocessor unit 250 from the sleep mode into the work mode.

In the case that the key A is blocked due to the humid climate or when a user sitting on a sofa and watching a TV program sits on the remote control in carelessness, the current key scan data Save Data surely remains in "110000" if no key is further pressed after a predetermined time, and the comparator unit 240 does not generate the wakeup signal "wakeup". Thus, the microprocessor unit 250 in the work mode enters in the sleep mode to save the power. It is sure that the key scan circuit 220, the storage unit 230, and the comparator unit 240 still work for scanning the keys on the keyboard 210 after the microprocessor unit 250 enters in the sleep mode. The scan frequency of the key scan circuit 220 can be, for example, 4 KHz.

Figure 5:
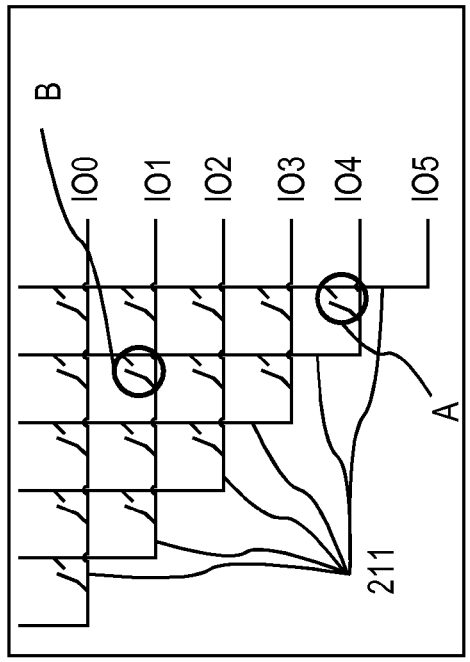
FIG. 5 is a schematic diagram of a further operation of a key scan circuit according to the invention.

FIG. 5 is a schematic diagram of a further operation of the key scan circuit 220 according to the invention. As shown in FIG. 5, two keys A, B are pressed, which is shown in the first column. In this case, the key scan circuit 220 generates the N current key scan data, i.e., "00000x(A)", "0100x0(B)", "000x00(C)", "00x000(D)", "1x0010(E)", and "x10000(F)". Thus, we have the current key scan data Save Data=A^B^C^D^E^F=1 0 0 0 1 0.

The second column in FIG. 5 shows that the key A is open and the key B is pressed, and in this case the N key scan data includes "00000x(A)", "0100x0(B)", "000x00(C)", "00x000 (D)", "0x0010(E)", and "x00000(F)". Thus, we have the current key scan data Save Data=A^B^C^D^E^F=0 1 0 0 1 0.

The third column in FIG. 5 shows that the key A is pressed and the key B is open, and in this case the N key scan data includes "00000x(A)", "0000x0(B)", "000x00(C)", "00x000 (D)", "1x0000(E)", and "x10000(F)". Thus, we have the current key scan data Save Data=A^B^C^D^E^F=1 1 0 0 0 0.

It is known from the current key scan data "Save Data" in the first, second, and third columns that the invention can detect all conditions of two keys and avoid the microprocessor unit 250 from being unable to enter in the sleep mode due to blocking of a key and thus wasting the power.

Figure 6:
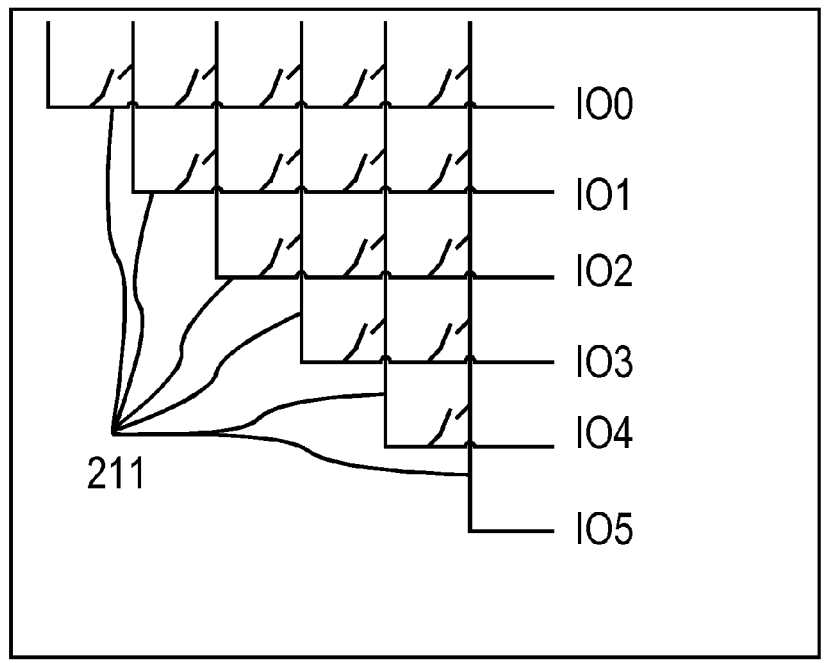
FIG. 6 is a schematic diagram of a still further operation of a key scan circuit according to the invention.

FIG. 6 is a schematic diagram of a still further operation of the key scan circuit 220 according to the invention. As compared with FIG. 3, the difference is that the key scan circuit 220 in FIG. 3 performs an XOR operation on the N key scan data obtained after the N scan lines 211 are scanned but, in FIG. 6, it performs the XOR operation on one key scan data immediately after one scan line 211 is scanned. Therefore, in FIG. 3, it is necessary to store the N key scan data of the N scan lines. However, in FIG. 6, only one key scan data of one scan line is stored, so as to save more memory.

Figure 7:
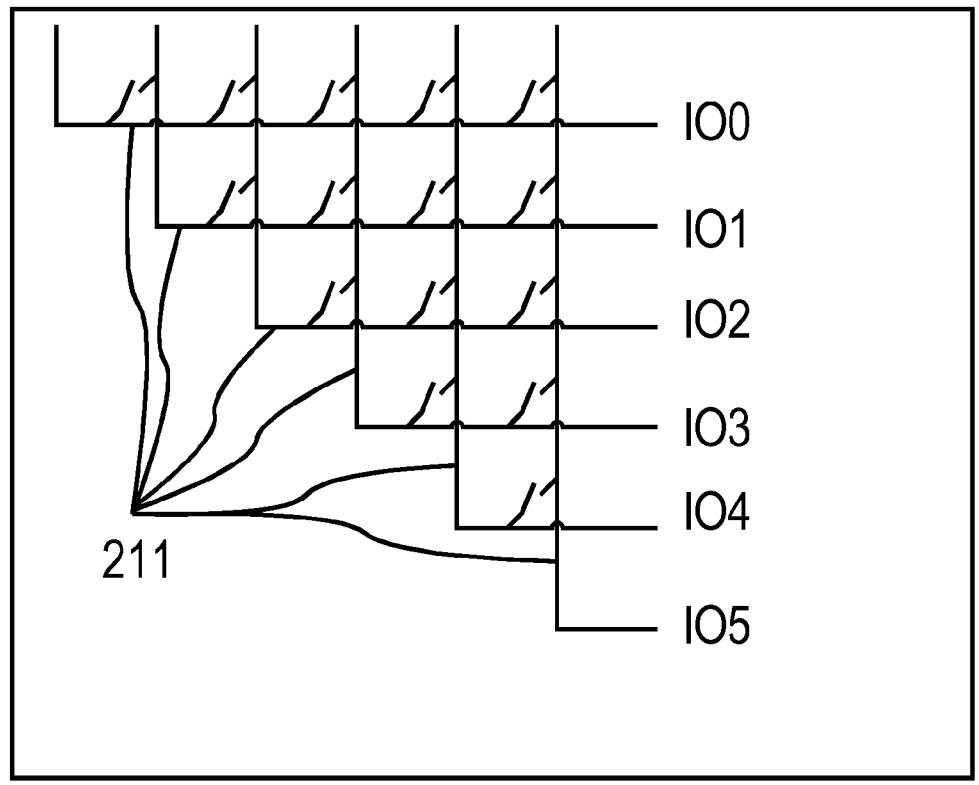
FIG. 7 is a schematic diagram of another key scan circuit according to the invention.

FIG. 7 is a schematic diagram of another key scan circuit 220 according to the invention. The N key scan data are in a form of N×N-bit matrix, and the key scan circuit 220 calculates the number of 1b in the upper triangle of the N×N-bit matrix for generating the current key scan data with 2 bits. In this case, the storage unit 230 is a 2-bit storage device. When the number of 1b in the upper triangle is zero, the current key scan data is 00b. When the number of 1b in the upper triangle is one, the current key scan data is 01b. When the number of 1b in the upper triangle is two, the current key scan data is 10b. Otherwise, the current key scan data is 11b.

As shown in FIG. 7, when a user does not press any key, the number of "1" in the upper triangle of the N×N-bit matrix is zero, and the current key scan data is 00b. The storage unit 230 temporarily stores the current key scan data Save Data (=00) as a previous key scan data.

Figure 8:
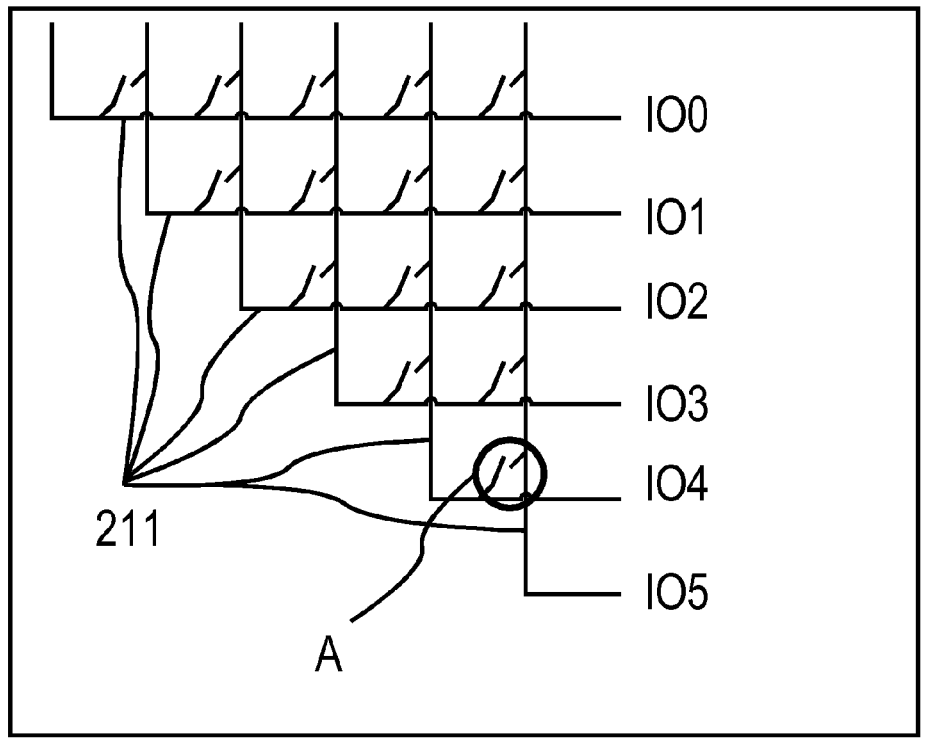
FIG. 8 is a schematic diagram of an operation of another key scan circuit according to the invention.

FIG. 8 is a schematic diagram of an operation of another key scan circuit 220 according to the invention. As shown in FIG. 8, the keys corresponding to the scan lines of the I/O pins IO4 and IO5 are pressed, and in this case the N key scan data includes "00000x(A)", "0000x0(B)", "000x00(C)", "00x000(D)", "1x0000(E)", and "x10000(F)". When the key A is pressed by the user, a number of "1" in the upper triangle of the N×N-bit matrix is one, and the current key scan data is 01b.

The comparator unit 240 compares the current key scan data Save Data (=00b) with the previous key scan data Save Data (=01b). Since the two data are different, the comparator unit 240 generates the wakeup signal "wakeup". Since the key A is actually pressed in FIGS. 7 and 8, the wakeup signal "wakeup" can be used to change the microprocessor unit 250 from the sleep mode into the work mode. As shown in FIGS. 3 and 4, when a key is blocked, the comparator unit 240 does not generate the wakeup signal "wakeup", and thus the microprocessor 250 in the work mode can enter in the sleep mode to save the power.

When a key in the multi-key keyboard is blocked and the microprocessor unit directly enters in the sleep mode, the blocked key causes a current consumption from several hundreds of µA to several tens of µA in the prior art, but the invention can reduce the current consumption to several µA. For example, if the pull down resistor is 10KΩ, the work voltage is 3V, and one key is blocked in entering in the sleep mode, the prior art requires the current consumption of (3V/10K)*1=300 µA. However, in the invention, if the pull down resistor is 10KΩ, the work voltage is 3V, and one key is blocked in entering in the sleep mode, the scan frequency of the key scan circuit 220 is 4 KHz, and the number of keys to be scanned is 20, so that the scan frequency of the blocked key is 4000 Hz/20=200 Hz. In this case, if the key scan circuit 220 has a scan timer of 10 µsec, the scan time is 10 µsec*200=2 m sec, and the blocked key in the sleep mode consumes the current of ((3V/10K)*1*2 m sec)≈0.6 µA. If each clock of the key scan circuit 220 consumes 1 µA-2 µA, a total of current consumption is 1.6 µA-3 µA, which is much lower than the current (300 µA) consumed in the prior art. Furthermore, it may happen in the prior art that the microprocessor unit cannot enter in the sleep mode, the microprocessor unit cannot wake up as soon as entering in the sleep mode, or the microprocessor unit cannot wake up from the sleep mode for normally working.

As cited, the prior art requires recording the state of each key before the microprocessor unit enters in the sleep mode, so that a comparison can be performed to generate a wakeup signal "wakeup" when a key is pressed. However, if there are 15 keys, it requires at least 15 bits to record the state of each key, rather than 6 bits or even 2 bits as shown in the invention. When the number of keys is increased, the difference between the prior art and the invention is increased on the required bits.

For example, if there are 101 keys, the prior art requires at least 101 bits to record the states of each key, but the invention requires only 15 bits (15×14/2=105). In addition, when a key is blocked, the ultra-low power wakeup circuit device in the invention can allow the microprocessor unit to enter in the sleep mode for reducing the power consumption and thus can be applied in a handheld device such as a remote control.

Although the present invention has been explained in relation to its preferred embodiment, it is to be understood that many other possible modifications and variations can be made without departing from the spirit and scope of the invention as hereinafter claimed.

What is claimed is:

1. An ultra-low power wakeup circuit device, comprising:
a keyboard with N scan lines, having a key installed in between every two scan lines, where N is an integer greater than one;
a key scan circuit connected to the N scan lines for sequentially outputting scanning signals from first scan line to N-th scan line in a predetermined time, thereby acquiring N key scan data of the N scan lines when a specific key is pressed and two scan lines corresponding to the specific key are short-circuited, the key scan circuit processing the N key scan data to generate a current key scan data;
a storage unit connected to the key scan circuit for temporarily storing the current key scan data as a previous key scan data; and
a comparator unit connected to the key scan circuit and the storage unit for comparing the current key scan data with the previous key scan data and generating a wakeup signal when the current key scan data is different from the previous key scan data;
wherein the comparator unit does not generate the wakeup signal when the current key scan data is identical to the previous key scan data;
further comprising a microprocessor unit connected to the comparator unit and the keyboard and having a sleep mode and a work mode, wherein the microprocessor unit is based on the wakeup signal to change from the sleep mode to the work mode when the comparator unit generates the wakeup signal, and remains in the sleep mode when the comparator unit does not generate the wakeup signal;
wherein the keyboard is a triangular-type scan keyboard with N×(N−1)/2 keys;
wherein each of the N key scan data has N bits, and when a key between i-th scan line and a j-th scan line is pressed, i-th and j-th bits of a key scan data corresponding to the key are each 1b; and
wherein the N key scan data is in a form of N×N-bit matrix, and the key scan circuit calculates a number of 1b in an upper triangle of the N×N-bit matrix for generating the current key scan data with 2 bits.

2. The device as claimed in claim 1, wherein the key scan circuit performs an XOR operation on the N key scan data for generating the current key scan data with N bits.

3. The device as claimed in claim 2, wherein the storage unit is an N-bit storage device.

4. The device as claimed in claim 1, wherein the storage unit is a 2-bit storage device.

5. The device as claimed in claim 1, wherein the key scan circuit has a scan frequency of 4 KHz.

6. The device as claimed in claim 1, further comprising at least one functional block, which does not work when the microprocessor unit is in the sleep mode.

\* \* \* \* \*